United States Patent
Luo et al.

(10) Patent No.: US 10,175,546 B2
(45) Date of Patent: Jan. 8, 2019

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xingyou Luo, Beijing (CN); Peizhi Cai, Beijing (CN); Xi Chen, Beijing (CN); Lei Ma, Beijing (CN); Jinyu Li, Beijing (CN); Yanchen Li, Beijing (CN); Fengchun Pang, Beijing (CN); Xue Cao, Beijing (CN); Shaojun Hou, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/555,307

(22) PCT Filed: Jan. 18, 2017

(86) PCT No.: PCT/CN2017/071521
§ 371 (c)(1),
(2) Date: Sep. 1, 2017

(87) PCT Pub. No.: WO2017/193632
PCT Pub. Date: Nov. 16, 2017

(65) Prior Publication Data
US 2018/0107039 A1  Apr. 19, 2018

(30) Foreign Application Priority Data
May 9, 2016  (CN) .......................... 2016 1 0301057

(51) Int. Cl.
*H01L 23/31* (2006.01)
*G02F 1/1368* (2006.01)
(Continued)

(52) U.S. Cl.
CPC ...... *G02F 1/1368* (2013.01); *G02F 1/134309* (2013.01); *H01L 21/77* (2013.01);
(Continued)

(58) Field of Classification Search
CPC ............. G02F 1/1368; G02F 1/134309; G02F 1/136227; G02F 2201/123;
(Continued)

(56) References Cited

U.S. PATENT DOCUMENTS

2001/0052952 A1    12/2001  Choo et al.
2016/0011467 A1*   1/2016   Choi ................. G02F 1/134309
                                                          257/72
2017/0322466 A1*   11/2017  Hao .................. G02F 1/134336

FOREIGN PATENT DOCUMENTS

CN    1334550 A    2/2002
CN    1637553 A    7/2005
(Continued)

OTHER PUBLICATIONS

English translation of PCT International Search Report, Application No. PCT/CN2017/071521, dated May 2, 2017, 2 pages.
(Continued)

*Primary Examiner* — Selim Ahmed
(74) *Attorney, Agent, or Firm* — Armstrong Teasdale LLP

(57) ABSTRACT

Embodiments of the present disclosure provide an array substrate and a manufacturing method thereof, and a display device. The array substrate includes a plurality of pixel structures. The pixel structure includes a gate electrode, a gate electrode insulating layer, an active layer, source and drain electrodes, and a passivation layer which are sequen-
(Continued)

tially stacked. The pixel structure further includes a first electrode and a second electrode. The first electrode is located between the gate electrode insulating layer and the passivation layer, and electrically connected to one of the source electrode and the drain electrode. The second electrode is located above the passivation layer. A first via passing through the passivation layer is provided, and the second electrode is electrically connected to one of the source electrode and the drain electrode through the first via.

19 Claims, 19 Drawing Sheets

(51) Int. Cl.
*H01L 21/77* (2017.01)
*H01L 27/12* (2006.01)
*G02F 1/1343* (2006.01)
*G02F 1/1362* (2006.01)

(52) U.S. Cl.
CPC .......... *H01L 23/3171* (2013.01); *H01L 27/12* (2013.01); *H01L 27/124* (2013.01); *H01L 27/1262* (2013.01); *G02F 1/136227* (2013.01); *G02F 2201/122* (2013.01); *G02F 2201/123* (2013.01)

(58) Field of Classification Search
CPC .......... G02F 2201/122; H01L 27/1262; H01L 27/124; H01L 23/3171
See application file for complete search history.

(56) References Cited

FOREIGN PATENT DOCUMENTS

| CN | 102097440 A | 6/2011 |
| CN | 103777418 A | 5/2014 |
| CN | 105914212 A | 8/2016 |

OTHER PUBLICATIONS

PCT Written Opinion, Application No. PCT/CN2017/071521,, dated May 2, 2017, 7 pages.: with English translation of relevant part.

* cited by examiner

ARRAY SUBSTRATE AND MANUFACTURING METHOD THEREOF, AND DISPLAY DEVICE

CROSS REFERENCE TO RELATED APPLICATIONS

This patent application is a National Stage Entry of PCT/CN2017/071521 filed on Jan. 18, 2017, which claims the benefit and priority of Chinese Patent Application No. 201610301057.4 filed on May 9, 2016, the disclosures of which are incorporated herein by reference in their entirety as part of the present application.

BACKGROUND

The present disclosure relates to the field of display technology, and more particularly, to an array substrate and a manufacturing method thereof, and a display device.

Currently, as display products are widely used in people's lives, requirements for the picture display quality of the display products are higher. For example, requirements for high Pixels Per Inch (PPI), high luminance and the like are proposed. In the development of high-PPI twisted-nematic (TN) display screens, panel manufacturers try to maximize the pixel aperture rate, so as to meet customers' requirements for high luminance. The left space in the pixel circuit for the storage capacitor is reduced accordingly, resulting in an increasing risk of flickering of the picture of the display screen.

BRIEF DESCRIPTION

Embodiments of the present disclosure provide an array substrate and a manufacturing method thereof, and a display device.

A first aspect of the present disclosure provides an array substrate including a plurality of pixel structures. The pixel structure includes a gate electrode, a gate electrode insulating layer, an active layer, source and drain electrodes, and a passivation layer which are sequentially stacked. The pixel structure further includes a first electrode and a second electrode. The first electrode is located between the gate electrode insulating layer and the passivation layer, and electrically connected to one of the source electrode and the drain electrode. The second electrode is located above the passivation layer. A first via passing through the passivation layer is provided. The second electrode is electrically connected to one of the source electrode and the drain electrode through the first via.

In embodiments of the present disclosure, the first electrode and the second electrode are pixel electrodes. Orthographic projections of the first electrode and the second electrode on the plane where the substrate is located coincide.

In embodiments of the present disclosure, the first electrode is electrically connected to the source electrode. The second electrode is electrically connected to the source electrode through the first via.

In embodiments of the present disclosure, the first electrode is located between the source electrode and the passivation layer.

In embodiments of the present disclosure, the first via further passes through the first electrode.

In embodiments of the present disclosure, the first electrode is located between the gate electrode insulating layer and the source electrode.

In embodiments of the present disclosure, the array substrate further includes a peripheral region. The peripheral region includes a gate electrode layer, the gate electrode insulating layer, a source/drain electrode layer and the passivation layer which are sequentially stacked. The peripheral region further includes a first electrode layer and a second electrode layer. The first electrode layer is located between the gate electrode insulating layer and the passivation layer, and electrically connected to the source/drain electrode layer. The second electrode layer is located above the passivation layer. A second via passing through the passivation layer is provided, and a third via passing through the passivation layer and the gate electrode insulating layer is provided. The second electrode layer is electrically connected to the source/drain electrode layer through the second via. The second electrode layer is electrically connected to the first electrode layer and the gate electrode layer through the third via.

In embodiments of the present disclosure, in the peripheral region, the first electrode layer is located between the source/drain electrode layer and the passivation layer, and the second via further passes through the first electrode layer.

In embodiments of the present disclosure, in the peripheral region, the first electrode layer is located between the source/drain electrode layer and the gate electrode insulating layer.

In embodiments of the present disclosure, in the peripheral region, the third via further passes through the first electrode layer.

In embodiments of the present disclosure, the peripheral region further includes the active layer located between the gate electrode insulating layer and the source/drain electrode layer.

In embodiments of the present disclosure, orthographic projections of the first electrode layer and the second electrode layer above the plane where the substrate is located coincide.

A second aspect of the present disclosure provides a manufacturing method of an array substrate for manufacturing the above-described array substrate. The manufacturing method includes forming a plurality of pixel structures. The step of forming a plurality of pixel structures includes forming a gate electrode, forming a gate electrode insulating layer, forming an active layer, forming source and drain electrodes, and forming a passivation layer. Forming a plurality of pixel structures further includes forming a first electrode between the gate electrode insulating layer and the passivation layer, and electrically connected to one of the source electrode and the drain electrode, and forming a second electrode above the passivation layer. Forming a plurality of pixel structures further includes forming a first via passing through the passivation layer. The second electrode is electrically connected to one of the source electrode and the drain electrode through the first via.

In embodiments of the present disclosure, the first electrode and the second electrode are formed using the same mask.

In embodiments of the present disclosure, the first electrode is electrically connected to the source electrode. The second electrode is electrically connected to the source electrode through the first via.

In embodiments of the present disclosure, the first electrode is located between the source electrode and the passivation layer.

In embodiments of the present disclosure, the first via further passes through the first electrode.

In embodiments of the present disclosure, the first electrode is located between the gate electrode insulating layer and the source electrode.

In embodiments of the present disclosure, the array substrate further includes a peripheral region. Forming the peripheral region includes forming a gate electrode layer, forming a gate electrode insulating layer, forming a source/drain electrode layer, and forming a passivation layer. Forming the peripheral region further includes forming a first electrode layer between the gate electrode insulating layer and the passivation layer, and electrically connected to the source/drain electrode layer, forming a second electrode layer above the passivation layer. Forming the peripheral region further includes forming a second via passing through the passivation layer, and a third via passing through the passivation layer and the gate electrode insulating layer. The second electrode layer is electrically connected to the source/drain electrode layer through the second via, and the second electrode layer is electrically connected to the first electrode layer and the gate electrode layer through the third via.

In embodiments of the present disclosure, in the peripheral region, the first electrode layer is located between the source/drain electrode layer and the passivation layer, and the second via further passes through the first electrode layer.

In embodiments of the present disclosure, in the peripheral region, the first electrode layer is located between the gate electrode insulating layer and the source/drain electrode layer.

In embodiments of the present disclosure, in the peripheral region, the third via further passes through the first electrode layer.

In embodiments of the present disclosure, forming the peripheral region further includes forming an active layer between the gate electrode insulating layer and the source/drain electrode layer.

In embodiments of the present disclosure, the first electrode layer and the second electrode layer are formed using the same mask.

A third aspect of the present disclosure provide a display device including the above-described array substrate.

According to the array substrate and the manufacturing method thereof and the display device according to the embodiments of the present disclosure, the storage capacitance in the pixel circuit may be increased, and the liquid crystal capacitance may be ensured, by designing an equal potential double-layer pixel electrode in the pixel structure. Thus, the flickering of the display screen may be reduced, without changing the mask.

BRIEF DESCRIPTION OF THE DRAWINGS

In order to more clearly illustrate the technical solutions of the embodiments of the present disclosure, the drawings of the embodiments will be briefly described below. It should be recognized that the drawings described below only relate to some embodiments of the present disclosure, rather than limiting the present disclosure, in which.

DETAILED DESCRIPTION

To make the embodiments of the present disclosure clearer, the technical solutions of the embodiments of the present disclosure will be described below clearly and comprehensively with reference to the accompanying drawings. It is obvious that the described embodiments are part of, not all of the embodiments of the present disclosure. All other embodiments obtained by those skilled in the art based on the described embodiments of the present disclosure without the need for creative work are also within the scope of the present disclosure.

Figure 1:
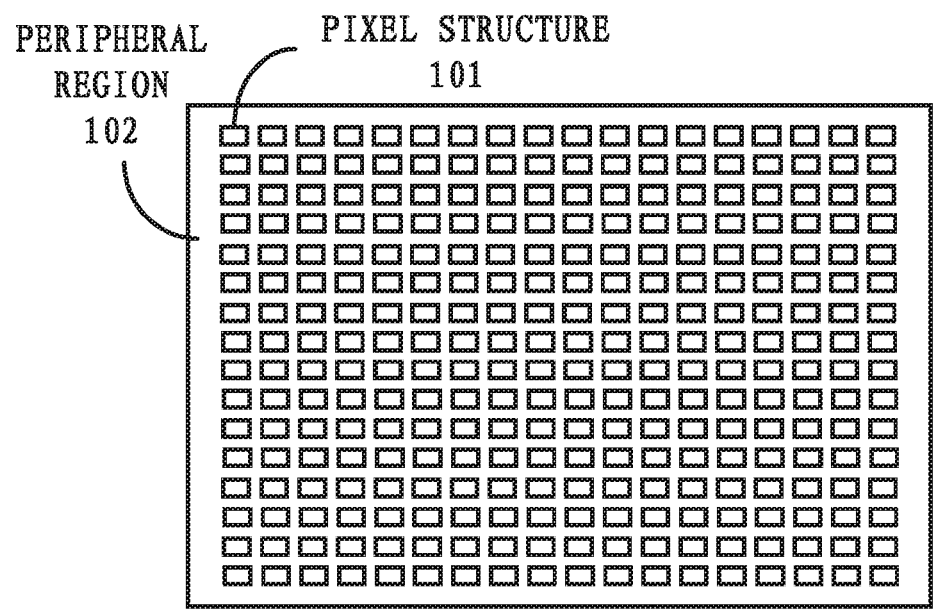
FIG. 1 is a planar schematic view of an array substrate.
Figure 2:
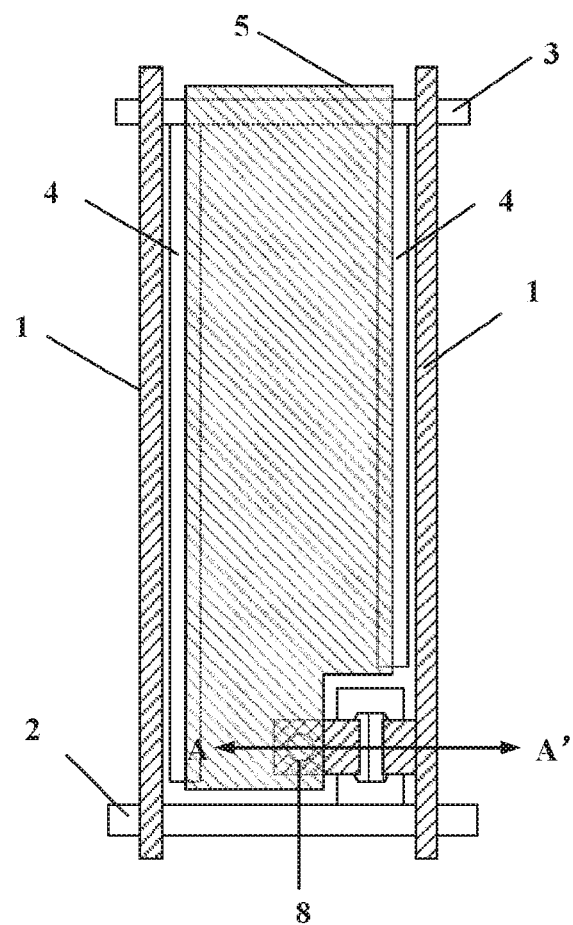
FIG. 2 is a schematic structural view of the pixel structure of the array substrate.
Figure 3:
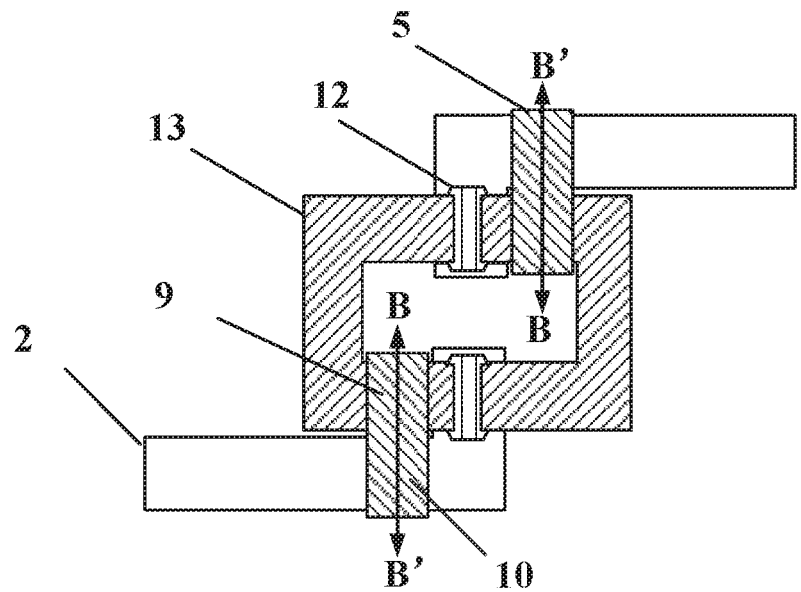
FIG. 3 is a schematic view of an antistatic short-circuit ring in a peripheral region of the array substrate.

FIG. 1 is a planar schematic view of an array substrate. As shown in FIG. 1, the array substrate may be substantially divided into a pixel region and a peripheral region 102 surrounding the pixel region. A plurality of pixel structures 101 are provided in the pixel region. It is to be understood that FIG. 1 is only for an intuitive illustration of an array substrate in which the arrangement, number, size, etc. of the pixel structure 101 are merely exemplary, and are not intended to limit the present disclosure. FIG. 2 is a schematic structural view of the pixel structure of the array substrate. FIG. 3 is a schematic view of an antistatic short-circuit ring in the peripheral region 102 of the array substrate.

In the pixel structure 101, in order to form the storage capacitance of the pixel circuit to maintain the data voltage of the pixel electrode, a metal strip 4 connecting a common electrode 3 is usually provided on a gate electrode layer 2 on both sides of a data line 1. The metal strip of the gate electrode layer 2 is an opaque gate electrode layer metal, and because of its effect of shielding light, it is also called "Shielding bar" (SB). An electrode layer 5 is connected to one electrode (for example, a source electrode) of a thin film transistor TFT located at a source/drain electrode layer in the pixel circuit through a first via 8 in a passivation layer 6 to realize the transfer of the data voltage. The electrode layer 5 and the shielding bar 4 forms a storage capacitor. In addition, the electrode layer 5 and the electrode of the corresponding color film substrate further form a liquid crystal capacitor, for controlling liquid crystal deflection. In general, the presence of the shielding bar 4 affects the pixel aperture ratio, and the higher the capacity of the storage capacitor, the larger the area of the shielding bar 4, the lower the corresponding aperture ratio.

When the picture of the developed display screen flickers due to low storage capacitance, the conventional way taken by panel manufacturers is to change the mask, so as to change the pattern of the layer structure of the pixel circuit and improve the capacity of the storage capacitor in the pixel circuit structure. However, due to the high cost of the mask, product development costs will be significantly increased, and moreover, the pixel aperture rate will be affected.

In the peripheral region, the electrode layer 5 is connected to a source/drain electrode layer 13 through a second via 9 of the passivation layer 6, and is connected to the gate electrode layer 2 through a third via 10 of the passivation layer 6 to form an antistatic short-circuit ring, to achieve electrostatic protection.

In the above structure, the capacity of the storage capacitor and the conductivity of the antistatic short-circuit ring still need to be improved.

Figure 4:
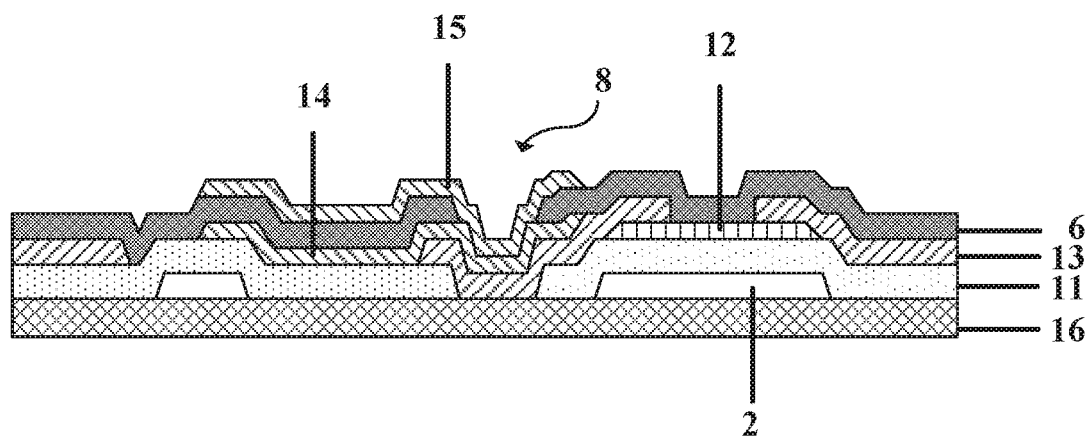
FIG. 4 is a schematic structural view of the cross section of the pixel structure of an array substrate according to a first embodiment of the present disclosure.
Figure 5:
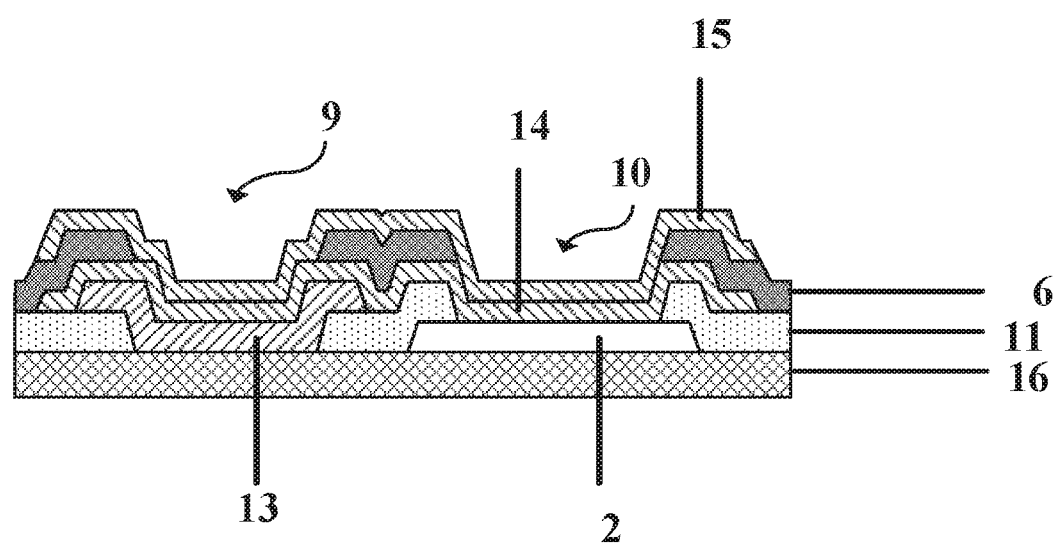
FIG. 5 is a schematic structural view of the cross section of a peripheral region of the array substrate according to the first embodiment of the present disclosure.

FIG. 4 is a schematic structural view of the cross section of the pixel structure of an array substrate according to a first embodiment of the present disclosure. FIG. 5 is a schematic structural view of the cross section of a peripheral region of the array substrate according to the first embodiment of the present disclosure.

Embodiments of the present disclosure provide an array substrate including a plurality of pixel structures. The pixel structure includes a gate electrode (located at the gate electrode layer 2), a gate electrode insulating layer 11, an active layer 12, source and drain electrodes (located at the source/drain electrode layer 13), and a passivation layer 6 which are sequentially stacked. The pixel structure further includes a first electrode (located at a first electrode layer 14) and a second electrode (located at a second electrode layer 15). The first electrode is located between the gate electrode insulating layer 11 and the passivation layer 6, and the first electrode is electrically connected to one of the source electrode and the drain electrode. The second electrode is located above the passivation layer 6. A first via 8 passing through the passivation layer 6 is provided, and the second electrode is electrically connected to one of the source electrode and the drain electrode through the first via 8.

The above pixel structure may be formed above any substrate base 16, for example, the substrate base 16 may be a glass or a thin film.

In embodiments of the present disclosure, the first electrode and the second electrode are pixel electrodes, and the orthographic projections of the first electrode and the second electrode on the plane where the array substrate is located coincide.

In embodiments of the present disclosure, the first electrode may be electrically connected to the source electrode. The second electrode may be electrically connected to the source electrode through the first via.

As shown in FIG. 4, the first electrode may be located between the source electrode and the passivation layer 6.

The source electrode located at the source/drain electrode layer 13, the first electrode, and the second electrode of the transistor TFT in the pixel circuit are electrically connected through the first via 8 passing through the passivation layer 6, and the potentials thereof are equal to each other. The first electrode and the second electrode serve as pixel electrodes to form a "double pixel electrode" structure.

Hereinafter, the principle of the "double pixel electrode" improving the picture flickering problem in the embodiment of the present disclosure will be described.

The picture flickering is related to the degree of fluctuation of the voltage drop of the pixel electrode caused by the gate voltage drop when the transistor TFT in the pixel circuit is turned off. The greater the degree of fluctuation, the heavier the picture flickers. The voltage drop ΔVp of the pixel electrode when the gate electrode of the transistor TFT in the pixel circuit is turned off is expressed by the formula (1).

$$\Delta V_p = \frac{C_{gs} \cdot (V_{GH} - V_{GL})}{C_{gs} + C_{lc} + C_{st}} \tag{1}$$

Wherein $C_{gs}$ is the capacitance between the source electrode and the gate electrode of the pixel transistor TFT. $V_{GH}$ and $V_{GL}$ are the voltages applied when the gate electrode is turned on and turned off, respectively, namely, applied driving voltages. $C_{lc}$ is the liquid crystal capacitance formed by the second electrode and the electrode of the corresponding color film substrate. $C_{st}$ is the storage capacitance formed by the first electrode and the common electrode 3 (i.e., the shielding bar 4).

Liquid crystals rotate when the picture is displayed, and $C_{lc}$ also changes. $C_{lc\_max}$ and $C_{lc\_min}$ are defined as the maximum and minimum values of the liquid crystal capacitance, respectively. $\Delta V_{p\_max}$ and $\Delta V_{p\_min}$ are the maximum and minimum values of pixel electrode voltage drop caused by the gate voltage drop when the gate electrode is turned off:

$$\Delta V_{p\_max} = \frac{C_{gs} \cdot (V_{GH} - V_{GL})}{C_{gs} + C_{1c\_min} + C_{st}} \quad (2)$$

$$\Delta V_{p\_min} = \frac{C_{gs} \cdot (V_{GH} - V_{GL})}{C_{gs} + C_{1c\_max} + C_{st}} \quad (3)$$

The degree of fluctuation of the voltage drop of the pixel electrode is expressed by the formula (4).

$$\Omega = \Delta V_{p\_max} - \Delta V_{p\_min} \quad (4)$$

$\Omega$ may present the value of the flickering degree of the display picture when the liquid crystal display screen works, and the greater the $\Omega$, the more serious the flickering degree.

According to the formulas (1) to (4), the following equation (5) may be derived:

$$\Omega = C_{gs} \cdot (V_{GH} - V_{GL}) \cdot \frac{(C_{1c\_max} - C_{1c\_min})}{(C_{gs} + C_{1c\_max} + C_{st}) \cdot (C_{gs} + C_{1c\_min} + C_{st})} \quad (5)$$

The maximum value $C_{1c\_}$max and the minimum value $C_{1c\_}$min of the liquid crystal capacitance formed by the second electrode and the electrode of the color film substrate in the pixel structure provided by the present embodiment are constant, when other conditions such as the thickness of the liquid crystal cell and the driving voltages $V_{GH}$ and $V_{GL}$ are constant. However, since only the gate electrode insulating layer 11, instead of the conventional passivation layer 6 and the gate electrode insulating layer 11, serves as a dielectric layer between the first electrode and the shielding bar 4, the first electrode is closer to the shielding bar 4. In the case that the overlapping area is constant, the storage capacitance $C_{st}$ formed is remarkably increased. It can be seen from the equation (5) that $\Omega$ decreases as $C_{st}$ increases, and the degree of the picture flickering of the display screen is reduced.

According to embodiments of the present disclosure, the storage capacitance in the pixel circuit is increased, and the display screen flickering may be reduced without changing the mask.

In embodiments of the present disclosure, the peripheral region of the array substrate includes the gate electrode layer 2, the gate electrode insulating layer 11, the source/drain electrode layer 13, and the passivation layer 6 which are sequentially stacked. The peripheral region further includes the first electrode layer 14 and the second electrode layer 15. The first electrode layer 14 is located between the gate electrode insulating layer 11 and the passivation layer 6, and the first electrode layer 14 is electrically connected to the source/drain electrode layer 13. The second electrode layer 15 is located above the passivation layer 6. A second via 9 passing through the passivation layer 6 is further provided, and a third via 10 passing through the passivation layer 6 and the gate electrode insulating layer 11 is provided. The second electrode layer 9 is electrically connected to the source/drain electrode layer 13 through the second via 9. The second electrode layer 15 is electrically connected to the first electrode layer 14 and the gate electrode layer 2 through the third via 10.

As shown in FIG. 5, the first electrode layer 14 may be located between the source/drain electrode layer 13 and the passivation layer 6.

The above-described structure of the peripheral region may be used to form an antistatic short-circuit ring in which the portion of the first electrode layer 14 adjacent to the second via 9 and the portion of the first electrode layer 14 adjacent to the third via 10 are electrically connected to each other. The portion of the second electrode layer 15 adjacent to the second via 9 and the portion of the second electrode layer 15 adjacent to the third via 10 are electrically connected to each other. In this way, the "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist in the antistatic short-circuit ring at the same time. The first electrode layer 14 is connected in parallel with the second electrode layer 15, reducing the connection resistance and achieving a better electrical connection. According to embodiments of the present disclosure, reducing the connection resistance in the antistatic short-circuit ring may achieve a better electrical connection effect.

Figure 6:
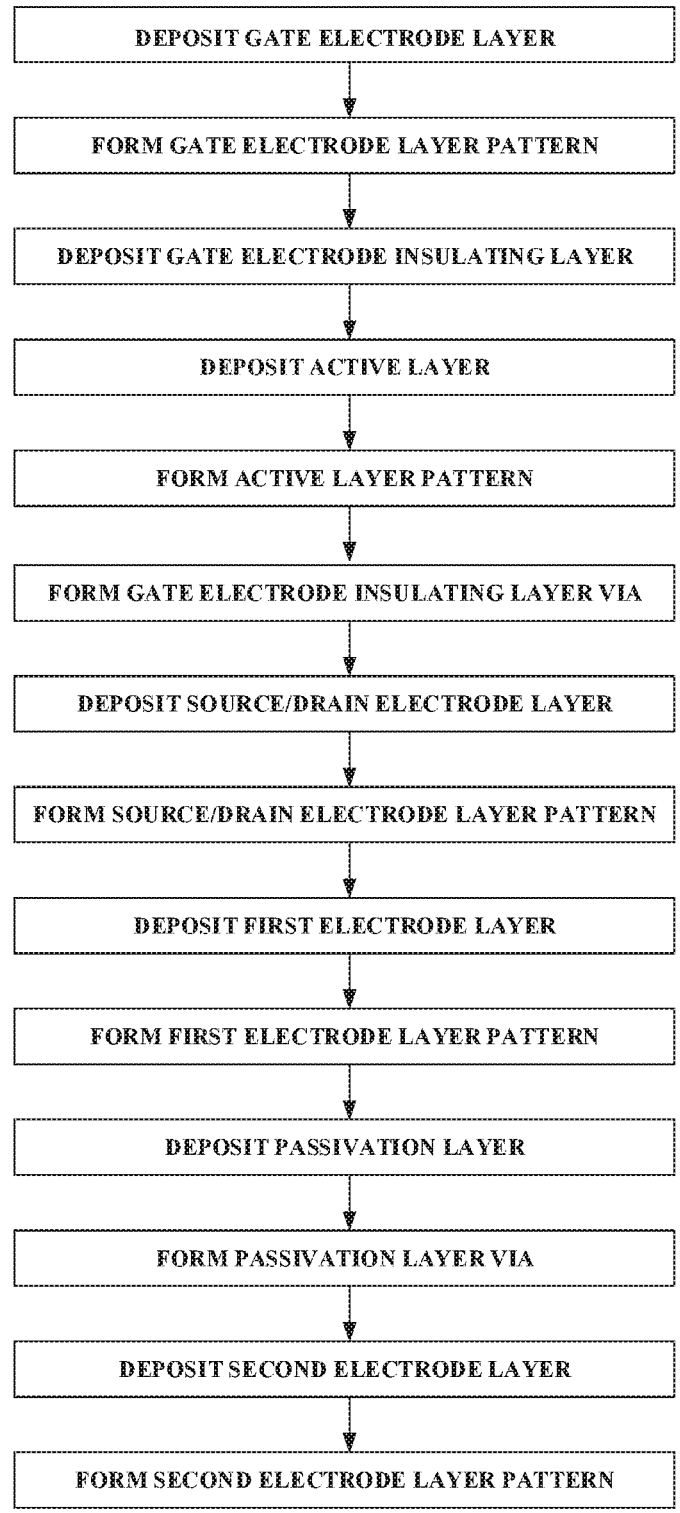
FIG. 6 is a first flowchart of a manufacturing method for manufacturing the array substrate shown in FIGS. 4 and 5.
Figure 7:
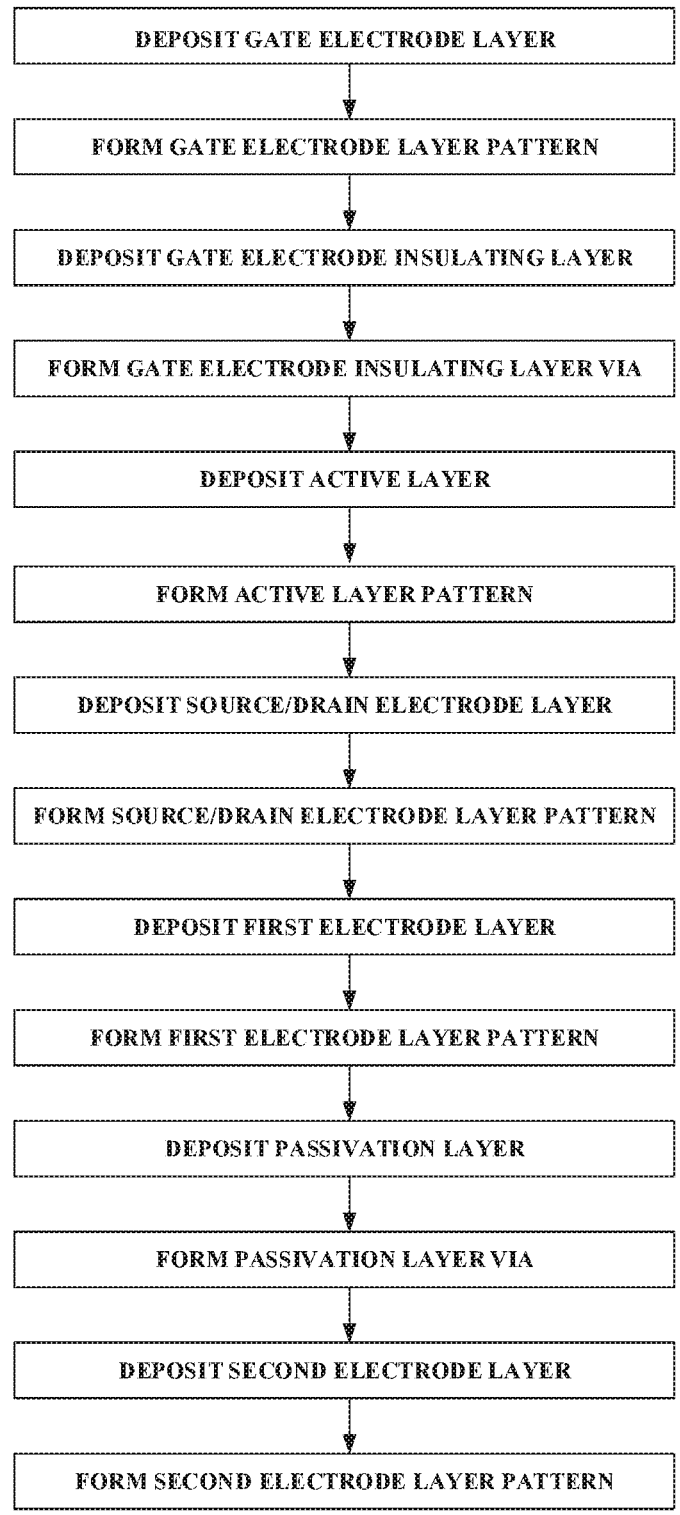
FIG. 7 is a second flowchart of the manufacturing method for manufacturing the array substrate shown in FIGS. 4 and 5.

FIG. 6 is a first flowchart of a manufacturing method for manufacturing the array substrate shown in FIGS. 4 and 5. FIG. 7 is a second flowchart of the manufacturing method for manufacturing the array substrate shown in FIGS. 4 and 5.

Embodiments of the present disclosure provide a manufacturing method of an array substrate for forming the above-described array substrate. The manufacturing method includes forming a plurality of pixel structures. The step of forming a plurality of pixel structures includes forming a gate electrode, forming a gate electrode insulating layer, forming an active layer, forming source and drain electrodes, and forming a passivation layer. Forming the pixel structure further includes forming a first electrode between the gate electrode insulating layer and the passivation layer, and electrically connected to one of the source electrode and the drain electrode, forming a second electrode above the passivation layer. The method further includes forming a first via passing through the passivation layer. The second electrode is electrically connected to one of the source electrode and the drain electrode through the first via.

In embodiments of the present disclosure, the first electrode may be electrically connected to the source electrode. The second electrode may be electrically connected to the source electrode through the first via.

In embodiments of the present disclosure, forming a peripheral region includes forming the gate electrode layer, forming the gate electrode insulating layer, forming the source/drain electrode layer, and forming the passivation layer. Forming the peripheral region further includes forming the first electrode layer between the gate electrode insulating layer and the passivation layer, and electrically connected to the source/drain electrode layer, forming the second electrode layer above the passivation layer. Forming the peripheral region further includes forming a second via passing through the passivation layer, and a third via passing through the passivation layer and the gate electrode insulating layer. The second electrode layer is electrically connected to the source/drain electrode layer through the second via. The second electrode layer is electrically connected to the first electrode layer and the gate electrode layer through the third via.

The pixel structure and the peripheral region may be formed at the same time. At this time, the corresponding portions or layers of the pixel structure and the peripheral region are simultaneously formed, and there is only a need to form different patterns in different regions to realize the corresponding functions. In addition, the first via, the second via, and the third via may further be formed at the same time.

In embodiments of the present disclosure, forming a first via includes forming a portion of the first via passing through the gate electrode insulating layer and forming a portion of the first via passing through the passivation layer. Forming the portion of the first via passing through the gate electrode insulating layer includes coating photoresist on the gate electrode insulating layer, shielding the photoresist coating using a mask, exposing the photoresist shielded by the mask, developing the exposed photoresist coating, etching the developed photoresist coating, and meanwhile, etching the gate electrode insulating layer at a first via position in the pixel structure to form the first via, and finally, peeling the photoresist coating off. Similarly, forming the portion of the first via passing through the passivation layer also includes coating photoresist on the passivation layer; shielding by a mask, exposing, developing, etching, i.e., etching the passivation layer at the first via position in the pixel structure, peeling photoresist. The portion of the first via passing through the gate electrode insulating layer and the portion of the first via passing through the passivation layer are formed using the same mask.

In embodiments of the present disclosure, the second via and the third via may be formed at the same time. Similar to forming the first via, forming the second via and the third via includes forming the portion of the third via passing through the gate electrode insulating layer, and forming the portions of the second via and the third via passing through the passivation layer. Forming the portion of the third via passing through the gate electrode insulating layer includes coating photoresist on the gate electrode insulating layer, shielding by a mask, exposing, developing, etching, and peeling photoresist. Forming the portions of the second via and the third via passing through the passivation layer includes coating photoresist on the passivation layer, shielding by mask, exposing, developing, etching, i.e., etching the passivation layer at the positions of the second via and the third via in the peripheral region, and peeling off the photoresist. The portions of the second via and the third via passing through the gate electrode insulating layer and the portions of the second via and the third via passing through the passivation layer are formed using the same mask.

As shown in FIG. 6, the manufacturing method of the array substrate may include depositing a gate electrode layer, forming a gate electrode layer pattern, depositing a gate electrode insulating layer, depositing an active layer, forming an active layer pattern, forming a gate electrode insulating layer pattern (i.e. forming the via of the gate electrode insulating layer), depositing a source/drain electrode layer, forming a source/drain electrode layer pattern, depositing a first electrode layer, forming a first electrode layer pattern, depositing a passivation layer, forming a passivation layer pattern (i.e., forming the via of the passivation layer), depositing a second electrode layer, and forming a second electrode layer pattern.

The second flowchart shown in FIG. 7 differs from the flowchart of the manufacturing method shown in FIG. 6 in the order of forming the via of the gate electrode insulating layer and forming the active layer pattern.

As described above, there are many ways of forming the pattern of each layer. For example, forming the pattern of each layer may include processes such as photoresist coating, shielding by mask, exposing, developing, etching, peeling photoresist, which are not described in detail herein.

In embodiments of the present disclosure, the same mask is used in the formation of the first electrode layer and the second electrode layer. The same mask is used in the formation of the patterns (i.e., the vias) of the passivation layer 6 and the gate electrode insulating layer 11. The same mask may be the same piece of mask. Using the same mask may save costs effectively. In addition, the storage capacitance may be effectively improved for the pixel structure, and the conduction performance of the antistatic short-circuit ring may be effectively improved for the peripheral region.

Specifically, providing the first electrode layer and the second electrode layer increases the storage capacitance in the pixel circuit, thereby reducing the picture flickering of the display screen. Forming the first electrode layer and the second electrode layer using the same mask may reduce the picture flickering of the display screen, without changing the mask.

Forming the vias of the passivation layer 6 and the gate electrode insulating layer 11 using the same mask may effectively realize the via bridging connection between the gate electrode layer and the source/drain electrode layer. The "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the via bridging resistance to a certain extent.

Figure 8:
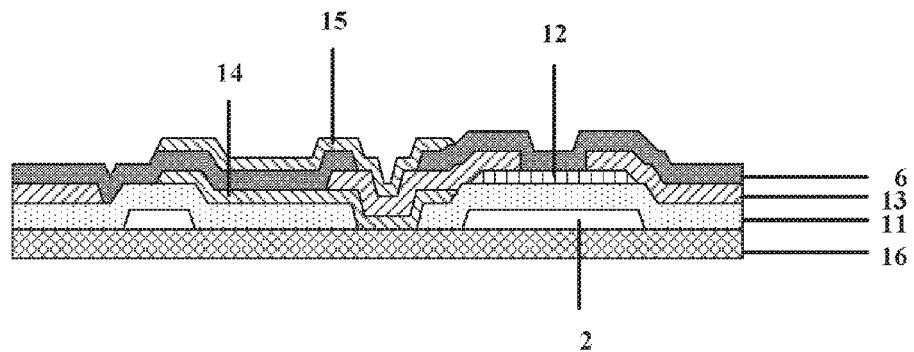
FIG. 8 is a schematic structural view of the cross section of the pixel structure of an array substrate according to a second embodiment of the present disclosure.
Figure 9:
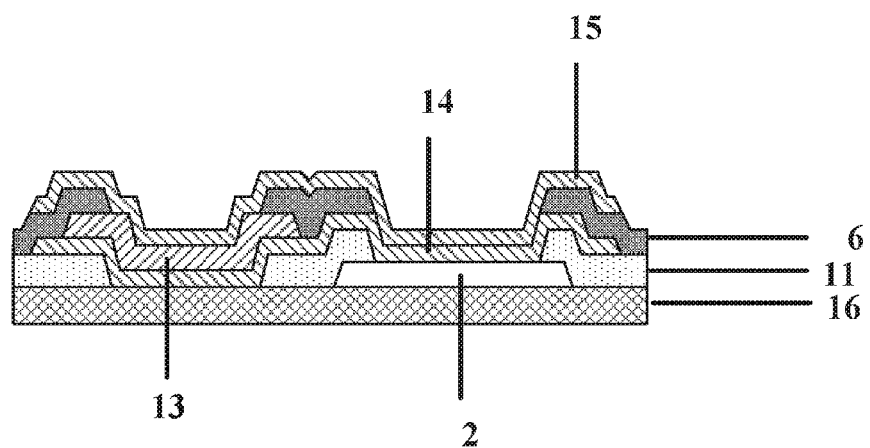
FIG. 9 is a schematic structural view of the cross section of a peripheral region of the array substrate according to the second embodiment of the present disclosure.

FIG. 8 is a schematic structural view of the cross section of the pixel structure of an array substrate according to a second embodiment of the present disclosure. FIG. 9 is a schematic structural view of the cross section of a peripheral region of the array substrate according to the second embodiment of the present disclosure.

The second embodiment differs from the first embodiment in that a first electrode layer pattern 14 is under a source/drain electrode layer pattern 13. Other structures of the second embodiment are identical to those of the first embodiment, and will not be described in detail.

It can be seen from FIG. 8 and FIG. 9 that in the pixel circuit, the storage capacitance in the pixel circuit is increased, and the picture flickering of the display screen may be reduced without changing the mask.

In the antistatic short-circuit ring, the "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the connection resistance and achieving a better electrical connection.

Figure 10:
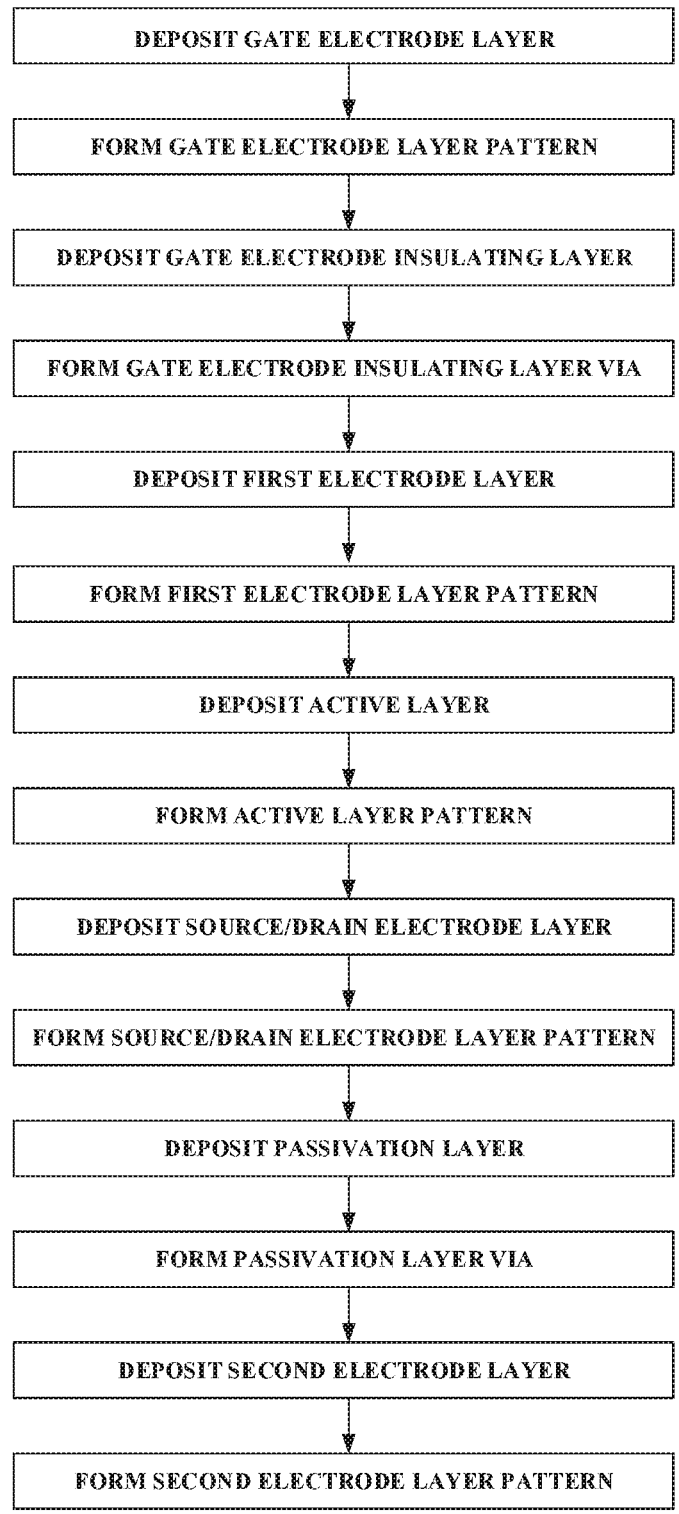
FIG. 10 is a first flowchart for a manufacturing method for manufacturing the array substrate shown in FIGS. 8 and 9.
Figure 11:
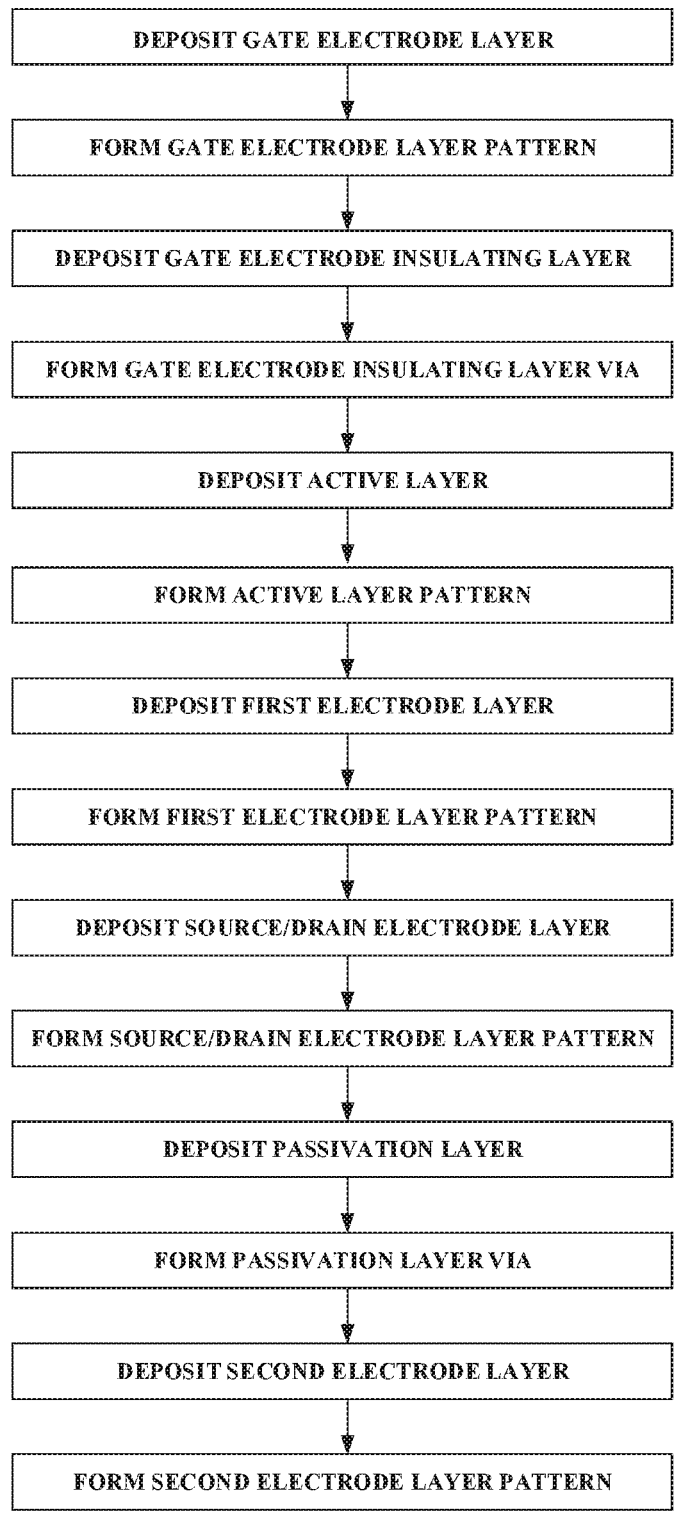
FIG. 11 is a second flowchart for the manufacturing method for manufacturing the array substrate shown in FIGS. 8 and 9.
Figure 12:
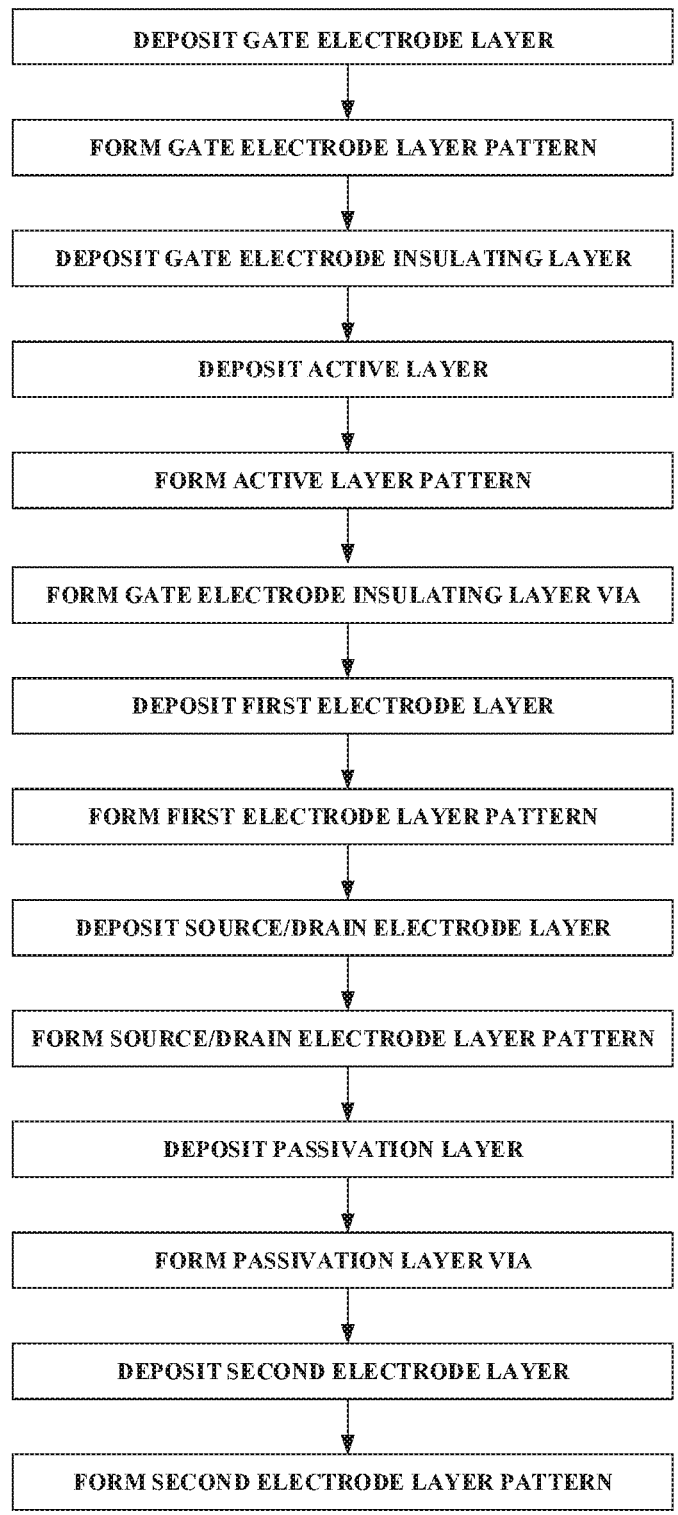
FIG. 12 is a third flowchart for the manufacturing method for manufacturing the array substrate shown in FIGS. 8 and 9.

FIG. 10 is a first flowchart for a manufacturing method for manufacturing the array substrate shown in FIGS. 8 and 9. FIG. 11 is a second flowchart for the manufacturing method for manufacturing the array substrate shown in FIGS. 8 and 9. FIG. 12 is a third flowchart for the manufacturing method for manufacturing the array substrate shown in FIGS. 8 and 9.

The manufacturing method of the array substrate of the second embodiment most differs from the manufacturing method of the array substrate of the first embodiment in that the first electrode layer is formed first, and then the source/drain electrode layer is formed.

As shown in FIG. 10, the manufacturing method of the array substrate may include depositing a gate electrode layer, forming a gate electrode layer pattern, depositing a gate electrode insulating layer, forming a gate electrode insulating layer pattern (i.e., forming the via of the gate electrode insulating layer), depositing a first electrode layer, forming a first electrode layer pattern, depositing an active layer, forming an active layer pattern, depositing a source/drain electrode layer, forming a source/drain electrode layer pattern, depositing a passivation layer, forming a passivation layer pattern (i.e., forming the via of the passivation layer), depositing a second electrode layer, and forming a second electrode layer pattern.

In FIG. 10, a gate electrode insulating layer pattern, a first electrode layer pattern, and an active layer pattern are sequentially formed. In FIG. 11, a gate electrode insulating layer pattern, an active layer pattern, and a first electrode layer pattern are sequentially formed. In FIG. 12, an active layer pattern, a gate electrode insulating layer pattern, and a first electrode layer pattern are sequentially formed.

The three flowcharts are different in the order of forming a gate electrode insulating layer pattern, an active layer pattern, and a first electrode layer pattern.

Similarly, providing the first electrode layer and the second electrode layer increases the storage capacitance in the pixel circuit, thereby reducing the picture flickering of the display screen. Forming the first electrode layer and the second electrode layer using the same mask may reduce the picture flickering of the display screen, without changing the mask.

Forming the vias of the passivation layer 6 and the gate electrode insulating layer 11 using the same mask may effectively realize the via bridging connection between the gate electrode layer 2 and the source/drain electrode layer 13. The "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the via bridging resistance to a certain extent.

Figure 13:
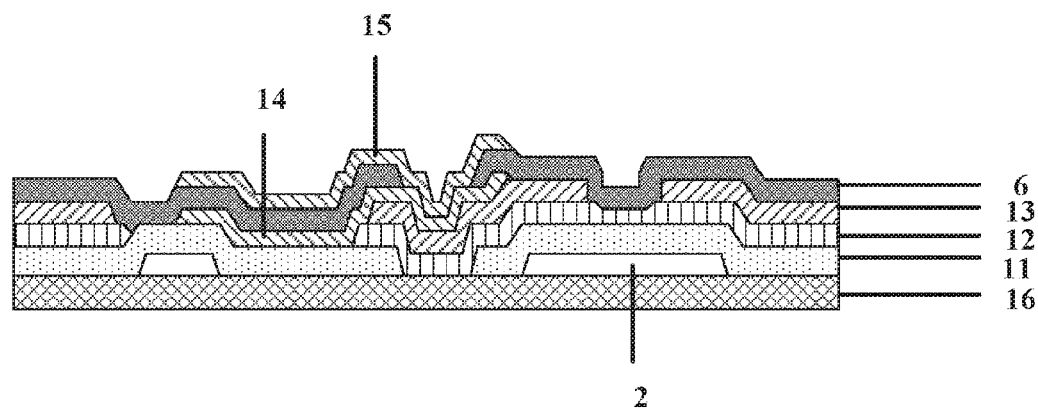
FIG. 13 is a schematic structural view of the cross section of the pixel structure of an array substrate according to a third embodiment of the present disclosure.
Figure 14:
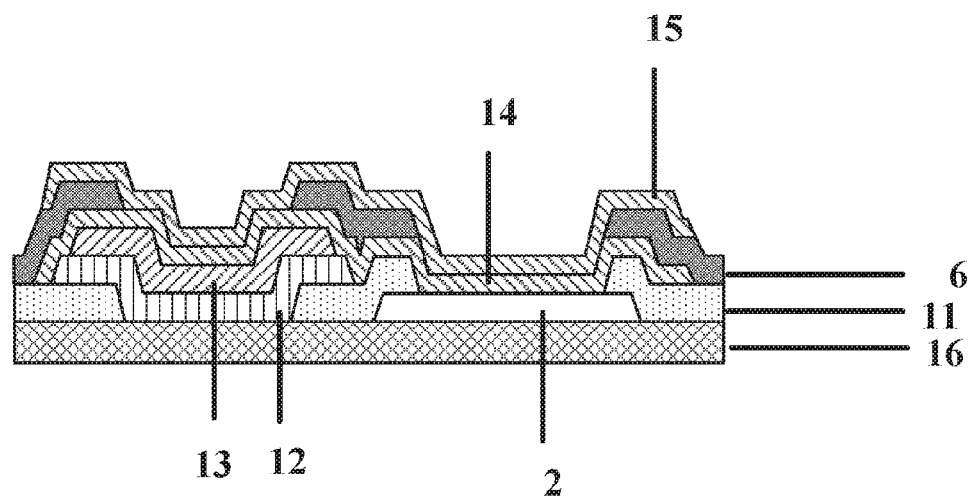
FIG. 14 is a schematic structural view of the cross section of a peripheral region of the array substrate according to the third embodiment of the present disclosure.

FIG. 13 is a schematic structural view of the cross section of the pixel structure of an array substrate according to a third embodiment of the present disclosure. FIG. 14 is a schematic structural view of the cross section of a peripheral region of the array substrate according to the third embodiment of the present disclosure.

The third embodiment differs from the first embodiment in that an active layer still exists under the source/drain electrode layer in the electrostatic short-circuit ring of the peripheral region.

As can be seen from FIG. 13 and FIG. 14, in the pixel circuit, the storage capacitance in the pixel circuit is increased, and the picture flickering of the display screen may be reduced without changing the mask.

In the antistatic short-circuit ring, the "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the connection resistance and achieving a better electrical connection.

Figure 15:
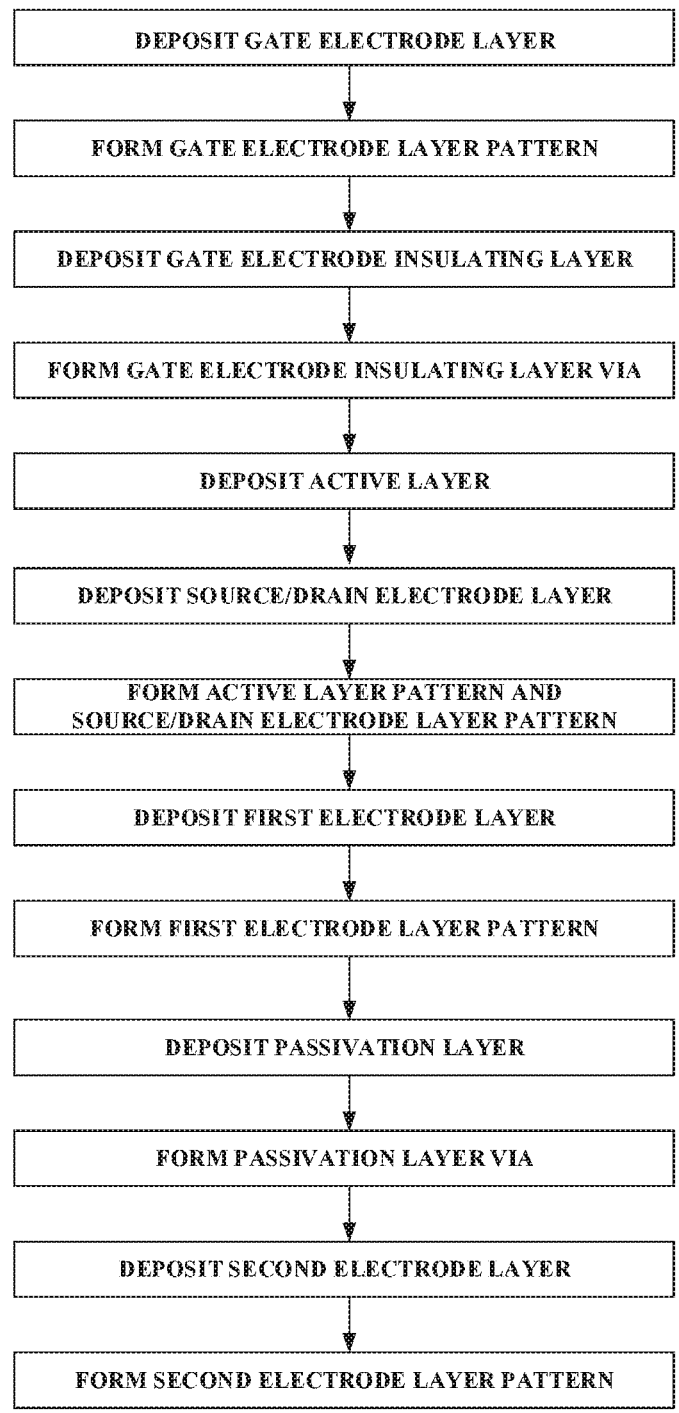
FIG. 15 is a flowchart for a manufacturing method for manufacturing the array substrate shown in FIGS. 13 and 14.

FIG. 15 is a flowchart for a manufacturing method for manufacturing the array substrate shown in FIGS. 13 and 14.

The manufacturing method of the array substrate of the third embodiment most differs from the manufacturing method of the array substrate of the first embodiment in being based on a four-mask process.

As shown in FIG. 15, the manufacturing method is based on a four-mask process. The manufacturing method includes depositing a gate electrode layer, forming a gate electrode layer pattern, depositing a gate electrode insulating layer, forming a gate electrode insulating layer pattern (i.e., forming the via of the gate electrode insulating layer), depositing an active layer, depositing a source/drain electrode layer, forming an active layer and a source/drain electrode layer pattern using a half tone mask, depositing a first electrode layer, forming a first electrode layer pattern, depositing a passivation layer, forming a passivation layer pattern (i.e., forming the via of the passivation layer), depositing a second electrode layer, and forming a second electrode layer pattern.

Similarly, providing the first electrode layer and the second electrode layer increases the storage capacitance in the pixel circuit, thereby reducing the picture flickering of the display screen. Forming the first electrode layer and the second electrode layer using the same mask may reduce the picture flickering of the display screen, without changing the mask.

Forming the vias of the passivation layer 6 and the gate electrode insulating layer 11 using the same mask may effectively realize the via bridging connection between the gate electrode layer and the source/drain electrode layer. The "source/drain electrode layer-first electrode layer 14-second electrode layer 15-first electrode layer 14-gate electrode layer 2" connection way and the "source/drain electrode layer-first electrode layer 14-gate electrode layer" connection way exist at the same time. The first electrode layer 14 is connected in parallel to the second electrode layer 15, reducing the via bridging resistance to a certain extent.

Figure 16:
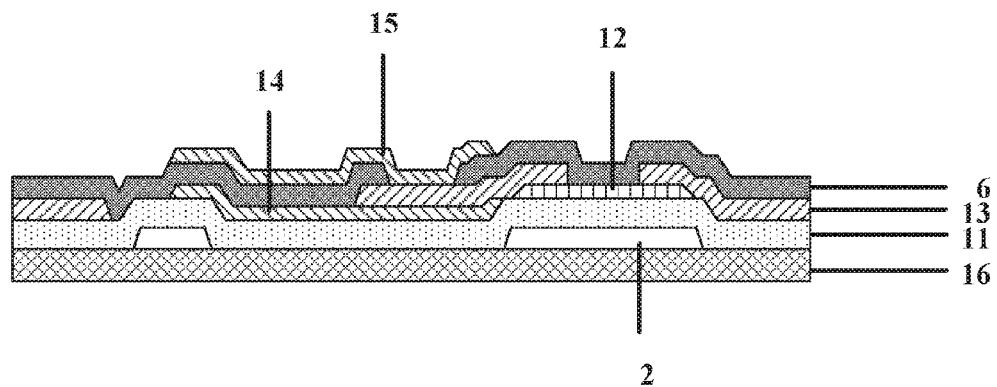
FIG. 16 is a schematic structural view of the cross section of the pixel structure of an array substrate according to a fourth embodiment of the present disclosure.
Figure 17:
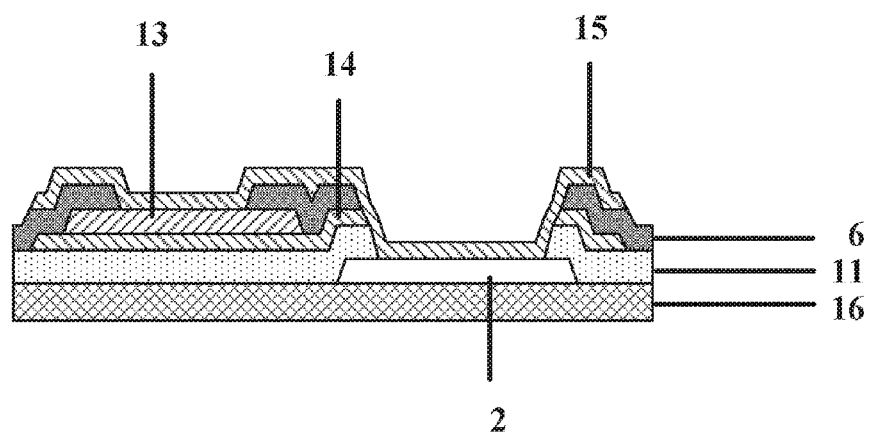
FIG. 17 is a schematic structural view of the cross section of a peripheral region of the array substrate according to the fourth embodiment of the present disclosure.

FIG. 16 is a schematic structural view of the cross section of the pixel structure of an array substrate according to a fourth embodiment of the present disclosure. FIG. 17 is a schematic structural view of the cross section of a peripheral region of the array substrate according to the fourth embodiment of the present disclosure.

The fourth embodiment differs from the first embodiment in that the pattern of the first electrode layer pattern 14 is under the pattern of the source/drain electrode layer pattern 13. The third via passes through the first electrode layer 14. Other structures of the fourth embodiment are identical to those of the first embodiment, and will not be described in detail.

As can be seen from FIG. 16 and FIG. 17, in the pixel circuit, the storage capacitance in the pixel circuit is increased, and the picture flickering of the display screen may be reduced without changing the mask.

In the antistatic short-circuit ring, the "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the connection resistance and achieving a better electrical connection.

In addition, every two of the first electrode layer 14, the second electrode layer 15, and the gate electrode layer 2 are connected to each other through the third via 10 to enhance the conductivity.

Figure 18:
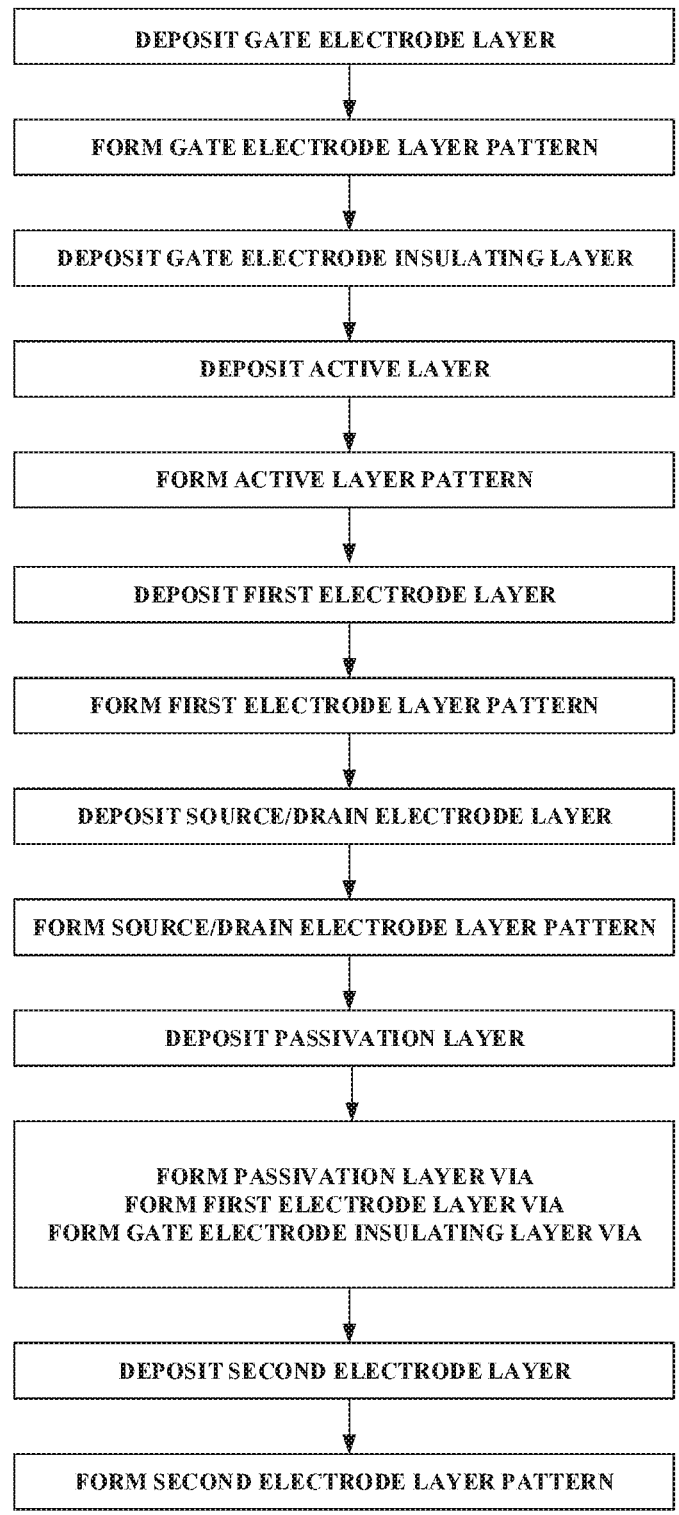
FIG. 18 is a first flowchart for a manufacturing method for manufacturing the array substrate shown in FIGS. 16 and 17.
Figure 19:
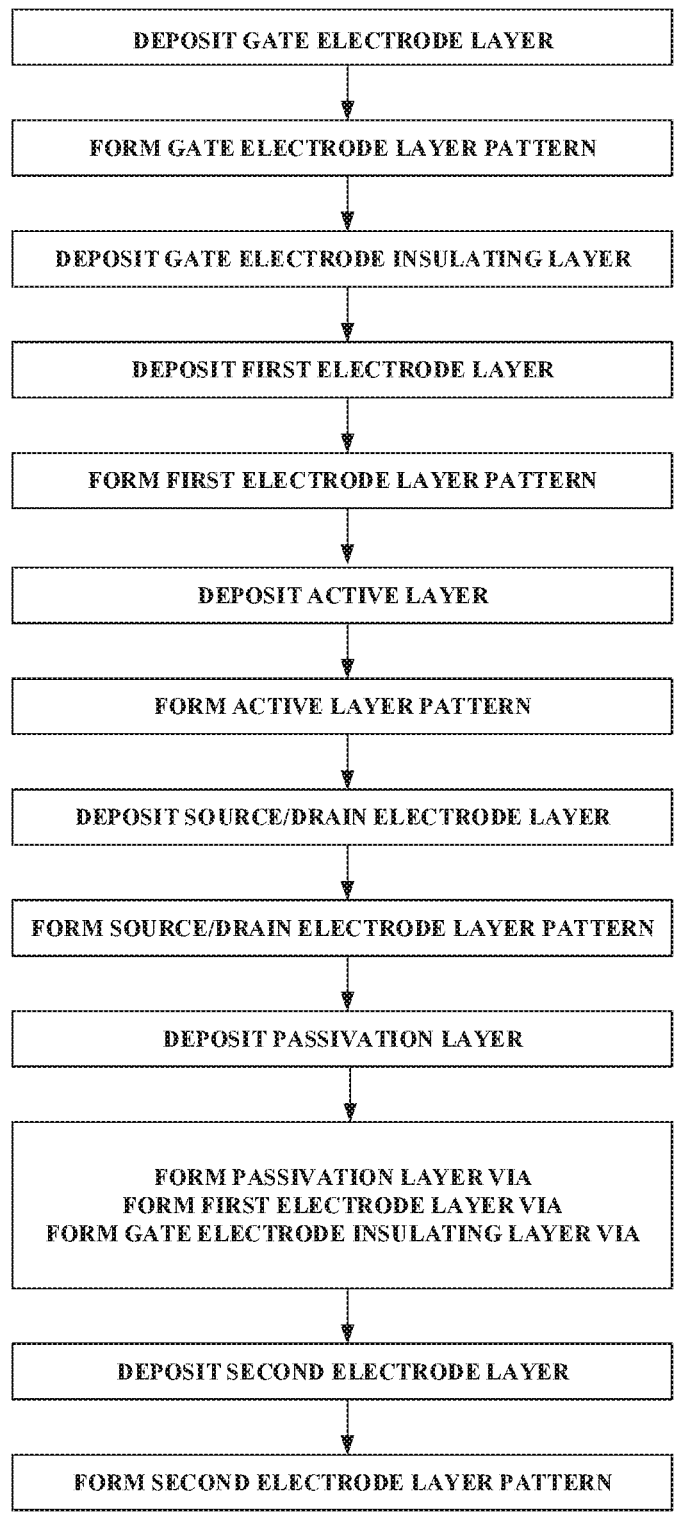
FIG. 19 is a second flowchart for the manufacturing method for manufacturing the array substrate shown in FIGS. 16 and 17.

FIG. 18 is a first flowchart for a manufacturing method for manufacturing the array substrate shown in FIGS. 16 and 17. FIG. 19 is a second flowchart for a manufacturing method for manufacturing the array substrate shown in FIGS. 16 and 17.

The manufacturing method of the array substrate of the fourth embodiment most differs from the manufacturing method of the array substrate of the first embodiment in forming the via passing through a plurality of layers after depositing the passivation layer.

In embodiments of the present disclosure, in the manufacturing method of the array substrate, forming the first via includes coating photoresist on the passivation layer, shielding by a mask, exposing, developing, etching, i.e. sequentially etching the passivation layer and the gate electrode insulating layer at the first via position in the pixel structure, and peeling photoresist.

In embodiments of the present disclosure, in the manufacturing method of the array substrate, the second via and the third via are simultaneously formed. Forming the second via and the third via includes coating photoresist on the passivation layer, shielding by a mask, exposing, developing, etching, i.e. sequentially etching the passivation layer, the first electrode layer and the gate electrode insulating layer at the second via position and the third via position in the peripheral region, peeling photoresist.

According to embodiments of the present disclosure, for the via passing through the plurality of layers, after photoresist is coated, the etching process is performed multiple times. The process flow is simplified, and the cost is reduced.

As shown in FIG. 18, the flow of the manufacturing method includes depositing a gate electrode layer, forming a gate electrode layer pattern, depositing a gate electrode insulating layer, depositing an active layer, forming an active layer pattern, depositing a first electrode layer, forming a first electrode layer pattern, depositing a source/drain electrode layer, forming a source/drain electrode layer pattern, depositing a passivation layer, forming the via of the passivation layer, forming the via of the first electrode layer, forming the via of the gate electrode insulating layer, depositing a second electrode layer, and forming a second electrode layer pattern.

The steps of forming the via of the passivation layer, forming the via of the first electrode layer and forming the via of the gate electrode insulating layer, include coating photoresist on the passivation layer, shielding by a mask, exposing, developing, etching, i.e. sequentially etching the passivation layer, the first electrode layer and the gate electrode insulating layer at the first via position, the second via position, and the third via position in the peripheral region, and peeling photoresist.

FIG. 19 differs from the flow shown in FIG. 18 in the order of forming the first electrode layer and the active layer.

Similarly, providing the first electrode layer and the second electrode layer increases the storage capacitance in the pixel circuit, thereby reducing the picture flickering of the display screen. Forming the first electrode layer and the second electrode layer using the same mask may reduce the picture flickering of the display screen, without changing the mask.

Forming the vias of the passivation layer 6, the first electrode layer 14, and the gate electrode insulating layer 11 using the same mask may effectively realize the via bridging connection between the gate electrode layer and the source/drain electrode layer. The "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the via bridging resistance to a certain extent.

In addition, for the via passing through the plurality of layers, the etching process is performed multiple times after photoresist is coated, simplifying the process flow, and further reducing the cost.

Figure 20:
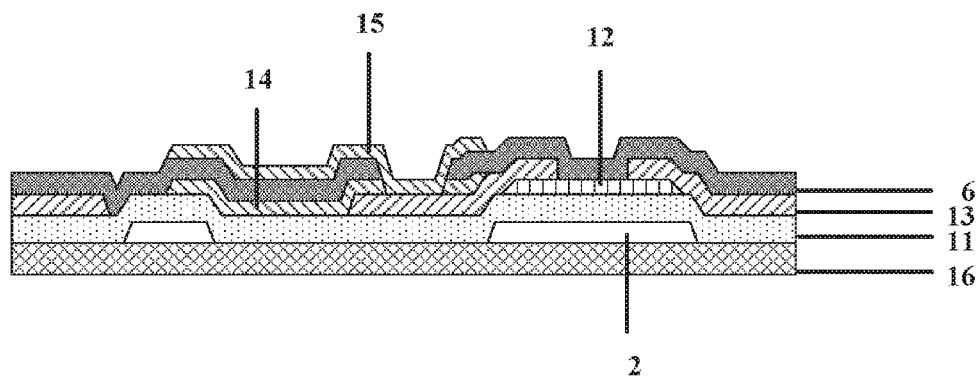
FIG. 20 is a schematic structural view of the cross section of the pixel structure of an array substrate according to a fifth embodiment of the present disclosure.
Figure 21:
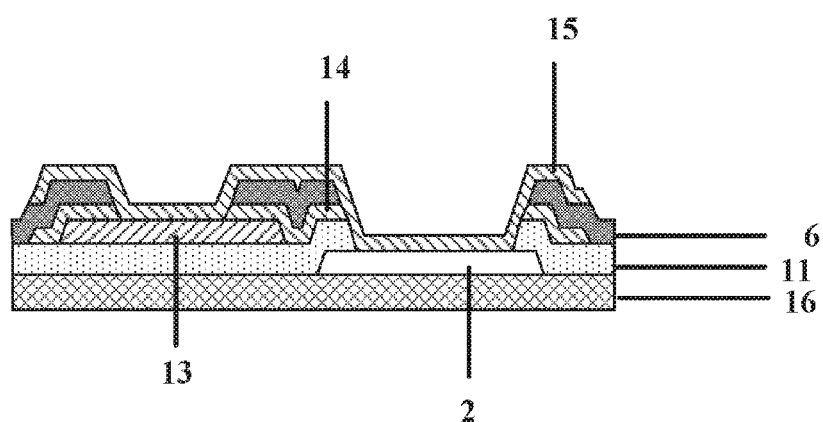
FIG. 21 is a schematic structural view of the cross section of a peripheral region of the array substrate according to the fifth embodiment of the present disclosure.

FIG. 20 is a schematic structural view of the cross section of the pixel structure of an array substrate according to a fifth embodiment of the present disclosure. FIG. 21 is a schematic structural view of the cross section of a peripheral region of the array substrate according to the fifth embodiment of the present disclosure.

The fifth embodiment differs from the first embodiment in that the first via 8, the second via 9, and the third via 10 pass through the first electrode layer 14.

As can be seen from FIG. 20 and FIG. 21, in the pixel circuit, the storage capacitance in the pixel circuit is increased, and the picture flickering of the display screen may be reduced without changing the mask.

In the antistatic short-circuit ring, the "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the connection resistance and achieving a better electrical connection.

Moreover, every two of the first electrode layer 14, the second electrode layer 15, and the source/drain electrode layer 13 are connected to each other through the first via 8, the second via 9, and the third via 10 to enhance the conductivity.

Figure 22:
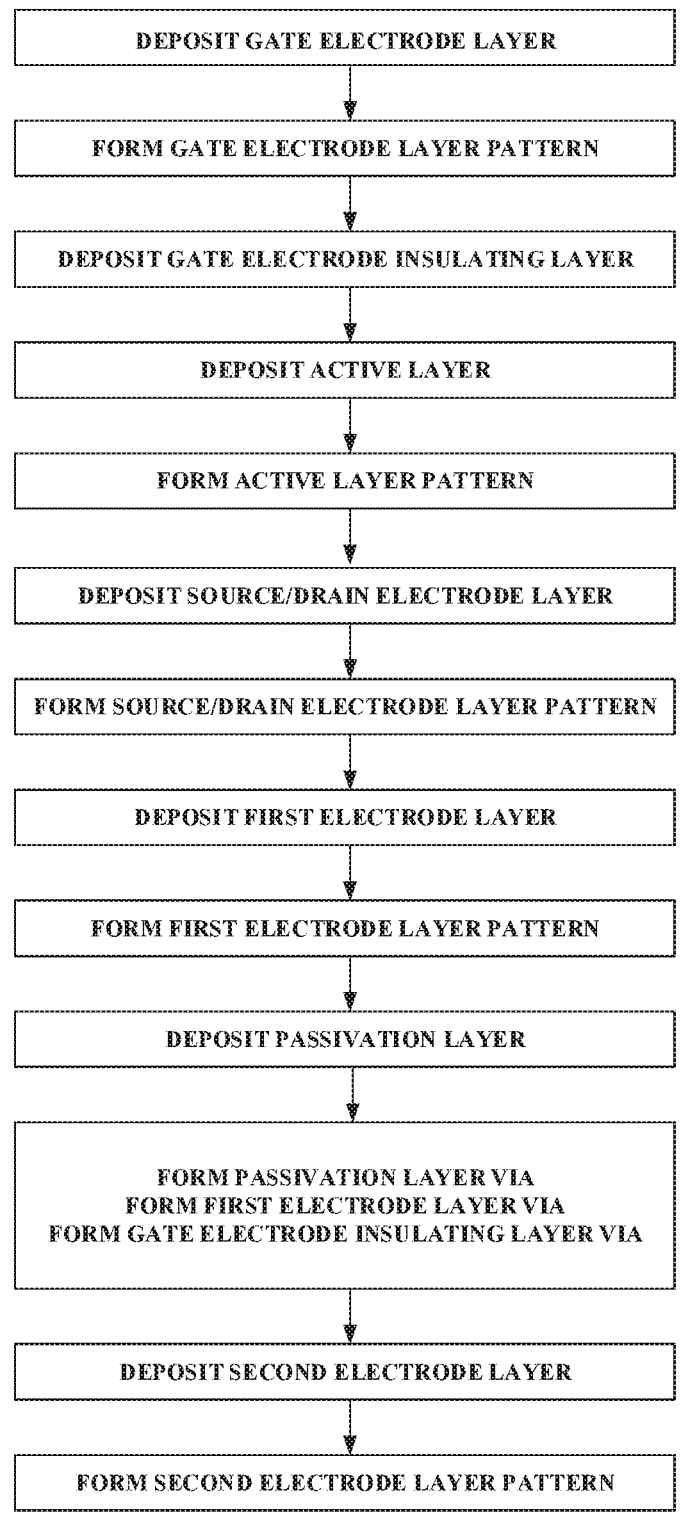
FIG. 22 is a flowchart for a manufacturing method for manufacturing the array substrate shown in FIGS. 20 and 21.

FIG. 22 is a flowchart for a manufacturing method for manufacturing the array substrate shown in FIGS. 20 and 21.

The manufacturing method of the array substrate of the fifth embodiment most differs from the manufacturing method of the array substrate of the first embodiment in forming the via passing through the plurality of layers after depositing the passivation layer.

As shown in FIG. 22, the flow of the manufacturing method includes depositing a gate electrode layer, forming a gate electrode layer pattern, depositing a gate electrode insulating layer, depositing an active layer, forming an active layer pattern, depositing a source/drain electrode layer, forming a source/drain electrode layer pattern, depositing a first electrode layer, forming a first electrode layer pattern, depositing a passivation layer, forming the via of the passivation layer, forming the via of the first electrode layer, forming the via of the gate electrode insulating layer, depositing a second electrode layer, and forming a second electrode layer pattern.

In embodiments of the present disclosure, the first electrode layer is located above the source/drain electrode layer, and the first via passes through the first electrode layer. The passivation layer, the first electrode layer, and the gate electrode insulating layer are sequentially etched at the first via position.

Similarly, providing the first electrode layer and the second electrode layer increases the storage capacitance in the pixel circuit, thereby reducing the picture flickering of the display screen. Forming the first electrode layer and the second electrode layer using the same mask may reduce the picture flickering of the display screen, without changing the mask.

Forming the vias of the passivation layer 6, the first electrode layer 14, and the gate electrode insulating layer 11 using the same mask may effectively realize the via bridging connection between the gate electrode layer and the source/ drain electrode layer. The "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the via bridging resistance to a certain extent.

For the via passing through the plurality of layers, the etching process is performed multiple times after photoresist is coated, simplifying the process flow, and further reducing the cost.

Figure 23:
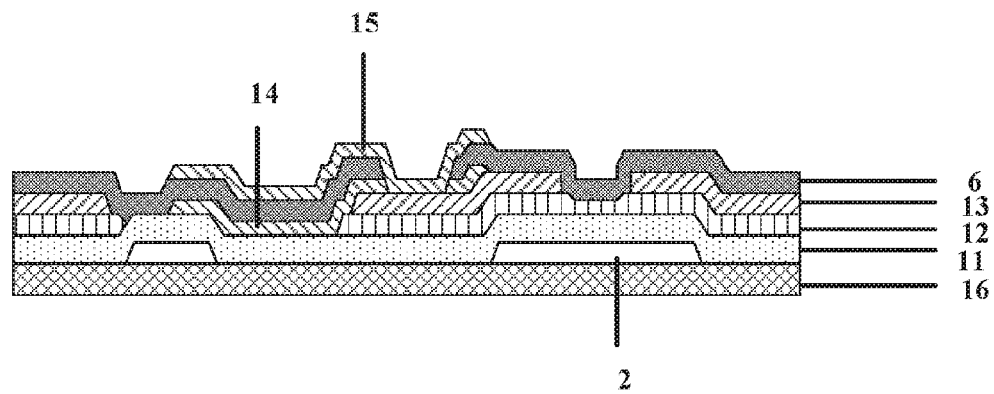
FIG. 23 is a schematic structural view of the cross section of the pixel structure of an array substrate according to a sixth embodiment of the present disclosure.
Figure 24:
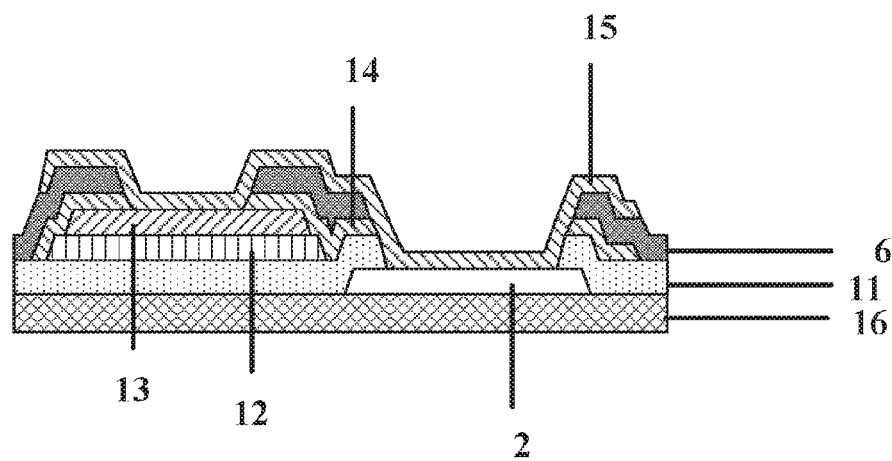
FIG. 24 is a schematic structural view of the cross section of a peripheral region of the array substrate according to the sixth embodiment of the present disclosure.

FIG. 23 is a schematic structural view of the cross section of the pixel structure of an array substrate according to a sixth embodiment of the present disclosure. FIG. 24 is a schematic structural view of the cross section of a peripheral region of the array substrate according to the sixth embodiment of the present disclosure.

The sixth embodiment differs from the first embodiment in that the active layer 12 is still present under the source/drain electrode layer 13 in the electrostatic short-circuit ring in the peripheral region, and the first via 8, the second via 9, and the third via 10 pass through the first electrode layer 14.

As can be seen from FIG. 23 and FIG. 24, in the pixel circuit, the storage capacitance in the pixel circuit is increased, and the picture flickering of the display screen may be reduced without changing the mask.

In the antistatic short-circuit ring, the "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the connection resistance and achieving a better electrical connection.

Moreover, every two of the first electrode layer 14, the second electrode layer 15, and the source/drain electrode layer 13 are connected to each other through the first via 8, the second via 9, and the third via 10 to enhance the conductivity.

Figure 25:
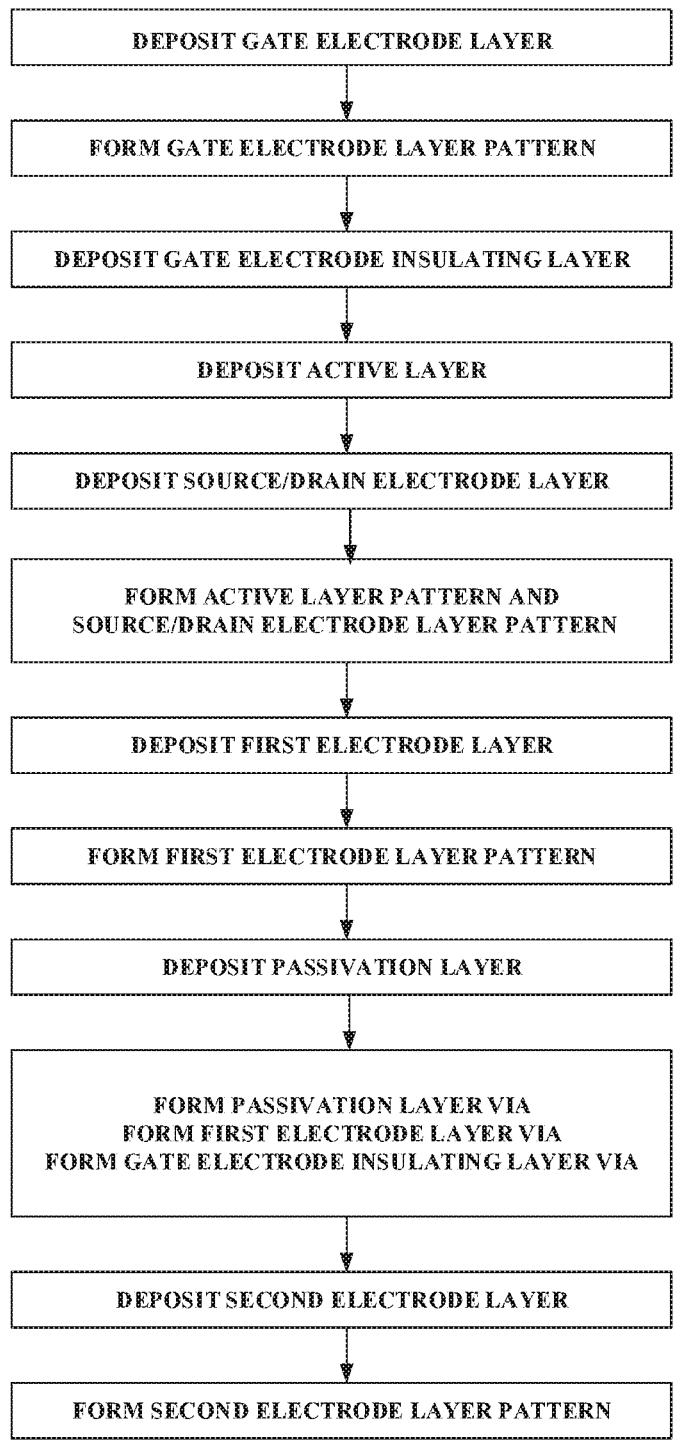
FIG. 25 is a flowchart of a manufacturing method for manufacturing the array substrate shown in FIGS. 23 and 24.

FIG. 25 is a flowchart of a manufacturing method for manufacturing the array substrate shown in FIGS. 23 and 24.

The manufacturing method of the array substrate of the sixth embodiment most differs from the manufacturing method of the array substrate of the first embodiment in forming the via passing through the plurality of layers after depositing the passivation layer. Moreover, the manufacturing method of the array substrate of the sixth embodiment is based on a four-mask process.

As shown in FIG. 25, the manufacturing method is based on a four-mask process, including depositing a gate electrode layer, forming a gate electrode layer pattern, depositing a gate electrode insulating layer, depositing an active layer, depositing a source/drain electrode layer, forming the patterns of the active layer and the source/drain electrode layer using a half tone mask, depositing a first electrode layer, forming a first electrode layer pattern, depositing a passivation layer, forming a passivation layer via, forming a first electrode layer via, forming a gate electrode insulating layer via, depositing a second electrode layer, and forming a second electrode layer pattern.

Similarly, providing the first electrode layer and the second electrode layer increases the storage capacitance in the pixel circuit, thereby reducing the picture flickering of the display screen, and forming the first electrode layer and the second electrode layer using the same mask may reduce the picture flickering of the display screen, without changing the mask.

Forming the vias of the passivation layer 6, the first electrode layer 14, and the gate electrode insulating layer 11 using the same mask may effectively realize the via bridging connection between the gate electrode layer and the source/drain electrode layer. The "source/drain electrode layer 13-first electrode layer 14-second electrode layer 15-first electrode layer 14-gate electrode layer 2" connection way and the "source/drain electrode layer 13-first electrode layer 14-gate electrode layer 2" connection way exist at the same time. The first electrode layer 14 is connected in parallel to the second electrode layer 15, reducing the via bridging resistance to a certain extent.

For the via passing through the plurality of layers, the etching process is performed multiple times after photoresist is coated, simplifying the process flow, and further reducing the costs.

The array substrate provided by the embodiment of the present disclosure may be used for a display panel, such as a liquid crystal panel.

Figure 26:
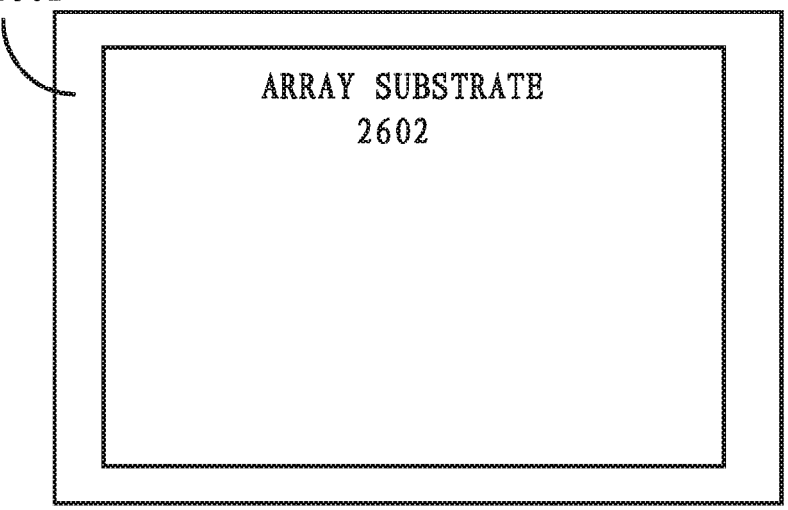
FIG. 26 is a schematic view of a display device including the array substrate according to embodiments of the present disclosure.

FIG. 26 is a schematic view of a display device including the array substrate according to embodiments of the present disclosure.

As shown in FIG. 26, the embodiments of the present disclosure further provide a display device 2601 including the above-described array substrate 2602. The display device may be any product or component having a display function, such as a mobile phone, a tablet computer, a television set, a monitor, a notebook computer, a digital photo frame, a navigator, or the like. For example, when the above-described array substrate is used for a liquid crystal panel, the display device may be any display product or component having a display function and including the liquid crystal panel, such as a mobile phone, a tablet computer, a television set, a monitor, a notebook computer, a digital photo frame, a navigator, and the like.

It is to be understood that the above embodiments are merely exemplary embodiments for the purpose of illustrating the principles of the present disclosure, however, the present disclosure is not limited thereto. It will be apparent to those of ordinary skill in the art that various modifications and improvements can be made therein without departing from the spirit and spirit of the present disclosure, which are further to be regarded to be within the scope of the present disclosure.

What is claimed is:

1. An array substrate comprising:
   a plurality of pixel structures and a peripheral region,
      wherein the pixel structure comprises a gate electrode, a gate electrode insulating layer, an active layer, source and drain electrodes, and a passivation layer which are sequentially stacked;
      wherein the pixel structure further comprises a first electrode and a second electrode;
      wherein the first electrode is located between the gate electrode insulating layer and the passivation layer, and is electrically connected to one of the source electrode and the drain electrode;
      wherein the second electrode is located above the passivation layer;
      wherein a first via passing through the passivation layer is provided;
      wherein the second electrode is electrically connected to one of the source electrode and the drain electrode through the first via;

wherein the peripheral region comprises a gate electrode layer, the gate electrode insulating layer, a source/drain electrode layer, and the passivation layer which are sequentially stacked;

wherein the peripheral region further comprises first electrode layer and a second electrode layer;

wherein the first electrode layer is located between the gate electrode insulating layer and the passivation layer, and is electrically connected to the source/drain electrode layer;

wherein the second electrode layer is located above the passivation layer;

wherein a second via passing through the passivation layer is provided;

wherein a third via passing through the passivation layer and the gate electrode insulating layer is provided;

wherein the second electrode layer is electrically connected to the source/drain electrode layer through the second via; and wherein the second electrode layer is electrically connoted to the first electrode layer and the gate electrode layer through the third via.

2. The array substrate according to claim 1,
wherein the first electrode and the second electrode are pixel electrodes; and
wherein orthographic projections of the first electrode and the second electrode coincide on a plane where the array substrate is located.

3. The array substrate according to claim 1,
wherein the first electrode is electrically connected to the source electrode; and
wherein the second electrode is electrically connected to the source electrode through the first via.

4. The array substrate according to claim 3, wherein the first electrode is located between the source electrode and the passivation layer.

5. The array substrate according to claim 4, wherein the first via further passes through the first electrode.

6. The array substrate according to claim 3, wherein the first electrode is located between the gate electrode insulating layer and the source electrode.

7. The array substrate according to claim 1,
wherein in the peripheral region, the first electrode layer is located between the source/drain electrode layer and the passivation layer; and
wherein the second via further passes through the first electrode layer.

8. The array substrate according to claim 1, wherein in the peripheral region, the first electrode layer is located between the source/drain electrode layer and the gate electrode insulating layer.

9. The array substrate according to claim 1, wherein in the peripheral region, the third via further passes through the first electrode layer.

10. The array substrate according to claim 1, wherein orthographic projections of the first electrode layer and the second electrode layer coincide on a plane where the array substrate is located.

11. A manufacturing method of an array substrate for manufacturing the array substrate according to claim 1, comprising forming the plurality of pixel structures, wherein forming the plurality of pixel structures comprises:
forming the gate electrode;
forming the gate electrode insulating layer;
forming the active layer;
forming the source and drain electrodes; and
forming the passivation layer, wherein forming the plurality of pixel structures further comprises:
forming the first electrode between the gate electrode insulating layer and the passivation layer, the first electrode electrically connected to one of the source electrode and the drain electrode; and
forming the second electrode above the passivation layer, wherein forming the plurality of pixel structures further comprises:
forming the first via passing through the passivation layer, wherein the second electrode is electrically connected to one of the source electrode and the drain electrode through the first via.

12. The manufacturing method of an array substrate according to claim 11, wherein the first electrode and the second electrode are formed using the same mask.

13. The manufacturing method of an array substrate according to claim 11,
wherein the first electrode is electrically connected to the source electrode; and
wherein the second electrode is electrically connected to the source electrode through the first via.

14. A display device comprising the array substrate according to claim 1.

15. The display device according to claim 14,
wherein the first electrode and the second electrode are pixel electrodes; and
wherein orthographic projections of the first electrode and the second electrode coincide on a plane where the array substrate is located.

16. The display device according to claim 14,
wherein the first electrode is electrically connected to the source electrode; and
wherein the second electrode is electrically connected to the source electrode through the first via.

17. The display device according to claim 16, wherein the first electrode is located between the source electrode and the passivation layer.

18. The display device according to claim 17, wherein the first via further passes through the first electrode.

19. The display device according to claim 16, wherein the first electrode is located between the gate electrode insulating layer and the source electrode.

* * * * *

UNITED STATES PATENT AND TRADEMARK OFFICE
CERTIFICATE OF CORRECTION

PATENT NO. : 10,175,546 B2
APPLICATION NO. : 15/555307
DATED : January 8, 2019
INVENTOR(S) : Xingyou Luo et al.

It is certified that error appears in the above-identified patent and that said Letters Patent is hereby corrected as shown below:

In the Claims

In Claim 1, Column 17, Line 6, delete "electrode laver;" and insert therefor -- electrode layer; --.

In Claim 1, Column 17, Lines 20-21, delete "electrically connoted to" and insert therefor -- electrically connected to --.

Signed and Sealed this
Twenty-sixth Day of March, 2019

Andrei Iancu
*Director of the United States Patent and Trademark Office*